United States Patent
Zhang et al.

(10) Patent No.: US 11,729,951 B2
(45) Date of Patent: Aug. 15, 2023

(54) HEAT FLUX MICRO COOLERS HAVING MULTI-STEPPED FEATURES AND FLUID WICKING

(71) Applicants: Toyota Motor Engineering & Manufacturing North America, Inc., Plano, TX (US); The Board of Trustees of the Leland Stanford Junior University, Stanford, CA (US); The Regents of the University of California, Merced, Merced, CA (US); Alliance for Sustainable Energy, LLC, Golden, CO (US)

(72) Inventors: Chi Zhang, Palo Alto, CA (US); Qianying Wu, Stanford, CA (US); Muhammad Shattique, Merced, CA (US); Neda Seyedhassantehrani, Merced, CA (US); Souvik Roy, Merced, CA (US); James Palko, Merced, CA (US); Sreekant Narumanchi, Littleton, CO (US); Bidzina Kekelia, Golden, CO (US); Sougata Hazra, Stanford, CA (US); Kenneth E. Goodson, Portola Valley, CA (US); Roman Giglio, Costa Mesa, CA (US); Ercan M. Dede, Ann Arbor, MI (US); Mehdi Asheghi, Oakland, CA (US)

(73) Assignees: Toyota Motor Engineering & Manufacturing North America, Inc., Plano, TX (US); The Board of Trustees of the Leland Stanford Junior University, Stanford, CA (US); The Regents of the University of California, Merced, Merced, CA (US); Alliance for Sustainable Energy, LLC, Golden, CO (US)

( * ) Notice: Subject to any disclaimer, the term of this patent is extended or adjusted under 35 U.S.C. 154(b) by 16 days.

(21) Appl. No.: 17/575,071

(22) Filed: Jan. 13, 2022

(65) Prior Publication Data
US 2023/0225082 A1    Jul. 13, 2023

(51) Int. Cl.
G06F 1/16      (2006.01)
H05K 5/00    (2006.01)
(Continued)

(52) U.S. Cl.
CPC ..... *H05K 7/20327* (2013.01); *H05K 7/20336* (2013.01)

(58) Field of Classification Search
CPC .......... H05K 7/20327; H05K 7/20336; H05K 7/2029; H05K 7/20309; H05K 7/20318
See application file for complete search history.

(56) References Cited

U.S. PATENT DOCUMENTS

| | | | |
|---|---|---|---|
| 7,782,616 B1 | 8/2010 | Myers et al. | |
| 10,191,521 B2 * | 1/2019 | Cheng | H05K 7/20809 |

(Continued)

FOREIGN PATENT DOCUMENTS

| | | | |
|---|---|---|---|
| WO | 2010147187 A1 | 12/2010 | |
| WO | 2011094293 A1 | 8/2011 | |

OTHER PUBLICATIONS

Jung et al., "Embedded Cooling with 3D Manifold for Vehicle Power Electronics Application: Single-phase Thermal-fluid Performance" International Journal of Heat and Mass Transfer 130 (2019) pp. 1108-1119, (https://nanoheat.stanford.edu/sites/default/files/publications/1-s2.0-S0017931018326206-main.pdf).

(Continued)

*Primary Examiner* — Anthony M Haughton
(74) *Attorney, Agent, or Firm* — Dinsmore & Shohl LLP

(57) ABSTRACT

A cooler device includes a cold plate and a manifold with fluid wicking structure. The cold plate includes an array of bonding posts and an array of fluid channels. Each bonding (Continued)

post of the array of bonding posts has a first height and is in contact with the manifold with fluid wicking structure. Each fluid channel of the array of fluid channels has a second height that is less than the first height. The array of fluid channels include a MIO secondary wick structure. The array of bonding posts is orthogonal to the array of fluid channels. The manifold with fluid wicking structure includes a plurality of spacer elements and a plurality of mesh layers. Each one of the plurality of spacer elements alternate with each one of the plurality of mesh layers in a stacked arrangement.

20 Claims, 9 Drawing Sheets

(51) Int. Cl.
*H05K 7/00* (2006.01)
*H05K 7/20* (2006.01)

(56) References Cited

U.S. PATENT DOCUMENTS

| | | | |
|---|---|---|---|
| 10,462,932 B2* | 10/2019 | Gaskill | B23P 15/26 |
| 10,945,333 B1 | 3/2021 | Joshi et al. | |
| 11,112,839 B2* | 9/2021 | Rush | G06F 1/20 |
| 11,156,409 B2* | 10/2021 | Zhang | F28D 15/04 |
| 2007/0056713 A1* | 3/2007 | Chiriac | H01L 23/427 |
| | | | 165/104.33 |
| 2008/0128898 A1* | 6/2008 | Henderson | H01L 23/427 |
| | | | 257/713 |
| 2011/0198057 A1* | 8/2011 | Lange | F28D 15/0233 |
| | | | 165/104.21 |
| 2018/0341298 A1* | 11/2018 | Cheng | H05K 7/20772 |
| 2019/0078227 A1 | 3/2019 | Joshi et al. | |
| 2019/0131204 A1* | 5/2019 | Gaskill | G06F 1/203 |
| 2020/0103947 A1* | 4/2020 | Rush | G06F 1/20 |
| 2021/0161026 A1 | 5/2021 | Joshi et al. | |
| 2021/0222956 A1* | 7/2021 | Zhang | F28D 15/04 |
| 2022/0192060 A1* | 6/2022 | Joshi | H01L 23/3733 |
| 2022/0240416 A1* | 7/2022 | Lunsman | H05K 7/20336 |

OTHER PUBLICATIONS

Wu et al., "Design and Fabrication of Graded Copper Inverse Opals (g-CIOs) for Capillary-Fed Boiling in High Heat Flux Cooling Applications" The American Society of Mechanical Engineers. Dec. 11, 2020. (https://asmedigitalcollection.asme.org/InterPACK/proceedingsabstract/InterPACK2020/84041/V001T07A011/1092160).

Palko et al., "Extreme Two-Phase Cooling from Laser-Etched Diamond and Conformal, Template-Fabricated Microporous Copper", WILEY-VCH Verlag GmbH & Co. KGaA, Germany, 2016.

* cited by examiner

HEAT FLUX MICRO COOLERS HAVING MULTI-STEPPED FEATURES AND FLUID WICKING

STATEMENT OF GOVERNMENT INTEREST

The subject matter of the present disclosure was developed with government support under Contract No. DE-AC36-08GO28308 awarded by the U.S. Department of Energy. Accordingly, the government has certain rights in this invention.

TECHNICAL FIELD

The present specification generally relates to heat flux micro-cooler assemblies and, more particularly, to high heat flux micro-cooler assemblies having a cold plate with multi-stepped features and manifold with fluid wicking structures.

BACKGROUND

Heat management devices may be coupled to a heat generation device, such as a power electronics device or integrated circuit (e.g., central processing unit, CPU, or graphics processing unit, GPU), to remove heat and lower the operating temperature of the heat generating device. A liquid coolant, such as a cooling fluid, may be introduced to the heat management device, where it receives heat from the heat management device, primarily through convective and/or conductive heat transfer. The fluid may further remove heat through latent heat of vaporization as it changes phase from a liquid to vapor. The vapor and/or remaining liquid coolant is then removed from the heat management device, thereby removing heat from the heat generating device. As power electronic or integrated circuit devices are designed to operate at increased power levels, the devices generate an increased corresponding heat flux. The increase in heat flux generated by the power electronics devices may render conventional heat sinks inadequate to reject sufficient heat to maintain a desired operating temperature in the power electronics device. Further, as power electronics modules or integrated circuit multi-chip modules are incorporated into increasingly compact and variable arrangements, more configurable and scalable cooling assemblies are desired.

SUMMARY

In one aspect, a cooler device is provided. The cooler device includes a cold plate and a manifold with fluid wicking structure. The cold plate includes an array of bonding posts and an array of fluid channels. Each bonding post of the array of bonding posts has a first height. Each fluid channel of the array of fluid channels have a second height that is less than the first height. The array of bonding posts is orthogonal to the array of fluid channels. The manifold with fluid wicking structure includes a plurality of spacer elements and a plurality of mesh layers. Each one of the plurality of spacer elements alternate with each one of the plurality of mesh layers in a stacked arrangement. The manifold with fluid wicking structure is in contact with the array of bonding posts.

In another aspect, an electronics assembly is provided. The electronics assembly includes a cooling assembly that includes a cold plate, a manifold with fluid wicking structure, and a manifold case. The cold plate includes an array of bonding posts, an array of fluid channels, and a metal inverse opal (MIO) structure. Each of the bonding posts of the array of bonding posts have a first height. The array of fluid channels have a second height that is less than the first height. The array of fluid channels have a trench with a trench surface. The MIO structure is positioned along the trench surface of the array of fluid channels. The manifold with fluid wicking structure includes a plurality of spacer elements and a plurality of mesh layers. Each one of the plurality of spacer elements alternate with each one of the plurality of mesh layers in a stacked arrangement. The manifold with fluid wicking structure is in contact with the array of bonding posts. The manifold case is configured to be in contact with the cold plate and encapsulate the manifold with fluid wicking structure and the array of fluid channels.

In yet another aspect, an assembly is provided. The assembly includes a cooling assembly that includes a cold plate, a manifold with fluid wicking structure, and a manifold case. The cold plate has a bonding area and a support member. The support member includes an array of bonding posts, an array of fluid channels, and a metal inverse opal structure. Each of the bonding posts of the array of bonding posts include a pair of spaced apart sidewalls and an upper surface extending between and from the pair of spaced apart sidewalls, the array of bonding posts have a first height. The array of fluid channels have a trench with a trench surface. The array of fluid channels have a second height that is less than the first height. The metal inverse opal structure is positioned along the pair of spaced apart sidewalls and the trench surface of each of the array of fluid channels. The manifold with fluid wicking structure includes a plurality of spacer elements and a plurality of mesh layers. Each one of the plurality of spacer elements alternate with each one of the plurality of mesh layers in a stacked arrangement. The manifold with fluid wicking structure is in contact with the array of bonding posts. The manifold case is configured to be in contact with the bonding area of the cold plate and encapsulate the manifold with fluid wicking structure and the support member.

These and additional objects and advantages provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments of the present disclosure are directed to a heat flux micro-cooler (μ-cooler) assembly for thermal management of CPU or GPU devices found in data centers, or power electronics devices found in vehicle energy conversion applications. Current trends require removal of heat fluxes up to 1000 W/cm$^2$. The μ-cooler assemblies described herein are intended to cool heat fluxes generated by a corresponding electronics device of 1000 W/cm$^2$ over a device size of 3 cm$^2$ with a temperature superheat of 20° C., and a unit thermal resistance of 0.02 cm$^2$-° C./W.

As described in more detail herein, the μ-cooler assembly includes a cold plate, a manifold with wicking structure, and a manifold case, or cover. The manifold case includes a fluid inlet, a fluid outlet, and at least one vapor outlet. The manifold with wicking structure includes a plurality of layers that alternate between spacer elements having an opening and mesh layers having a plurality of pores. The cold plate includes a support member, such as a substrate, that has microstructures coated with a metal inverse opal (MIO) secondary wicking structure. Liquid coolant flows into the manifold case through the fluid inlet, flows into the substrate of the cold plate, through mesh layers of the manifold wicking structure and secondary MIO wick via a capillary action, contacts the substrate to cool a heat-generating device, and then evaporates into a vapor. Liquid coolant that does not contact the substrate is routed out of the μ-cooler assembly through the fluid outlet. The vapor created due to boiling at the cold plate rises, is collected in a top cavity, and then exits the μ-cooler assembly through the at least one vapor outlet.

The substrate of the cold plate further includes a plurality of multi-stepped features. The plurality of multi-stepped features include an array of fluid channels and an array of bonding posts. The MIO secondary wick structure is positioned along various surfaces of the array of fluid channels and provides enhanced nucleation sites for the liquid coolant. The mesh layers of the manifold wicking structure provide micro liquid channels through which the liquid coolant may flow toward the substrate in the capillary action. The spacer elements also enable the liquid coolant to flow laterally through the cooling device while permitting the vapor to flow through the interstitial openings between mesh layers toward the upper cavity.

Figure 1:
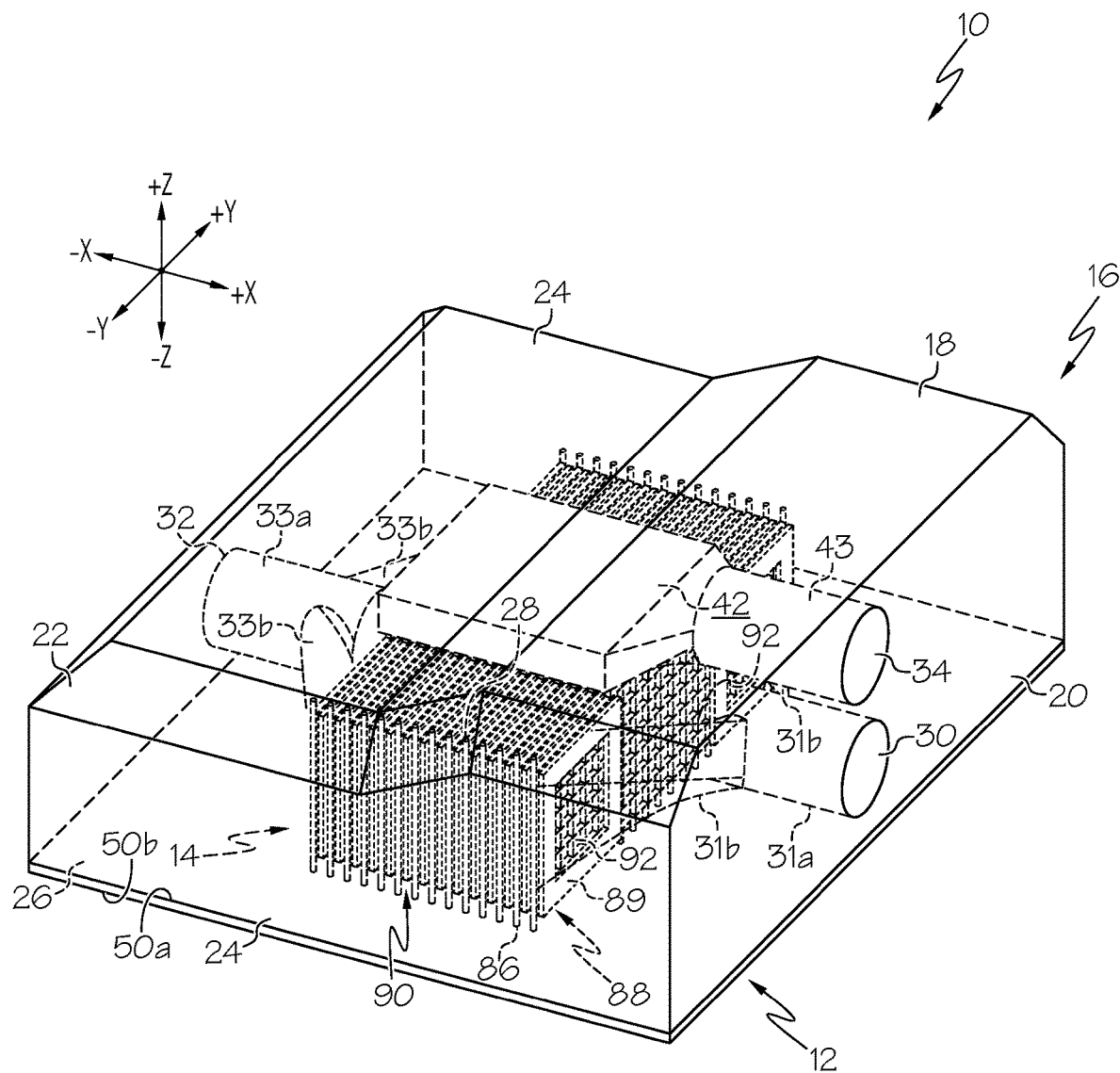
FIG. 1 schematically depicts a perspective view of an example μ-cooler assembly according to one or more embodiments shown or described herein.

As used herein, the term "longitudinal direction" refers to the forward-rearward direction of the μ-cooler assembly (i.e., in the +/−X-direction depicted in FIG. 1). The term "lateral direction" refers to the cross μ-cooler assembly direction (i.e., in the +/−Y-direction depicted in FIG. 1), and is transverse to the longitudinal direction. The term "vertical direction" or "up" or "above" or "below" refer to the upward-downward direction of the μ-cooler assembly (i.e., in the +/−Z-direction depicted in FIG. 1).

Figure 2:
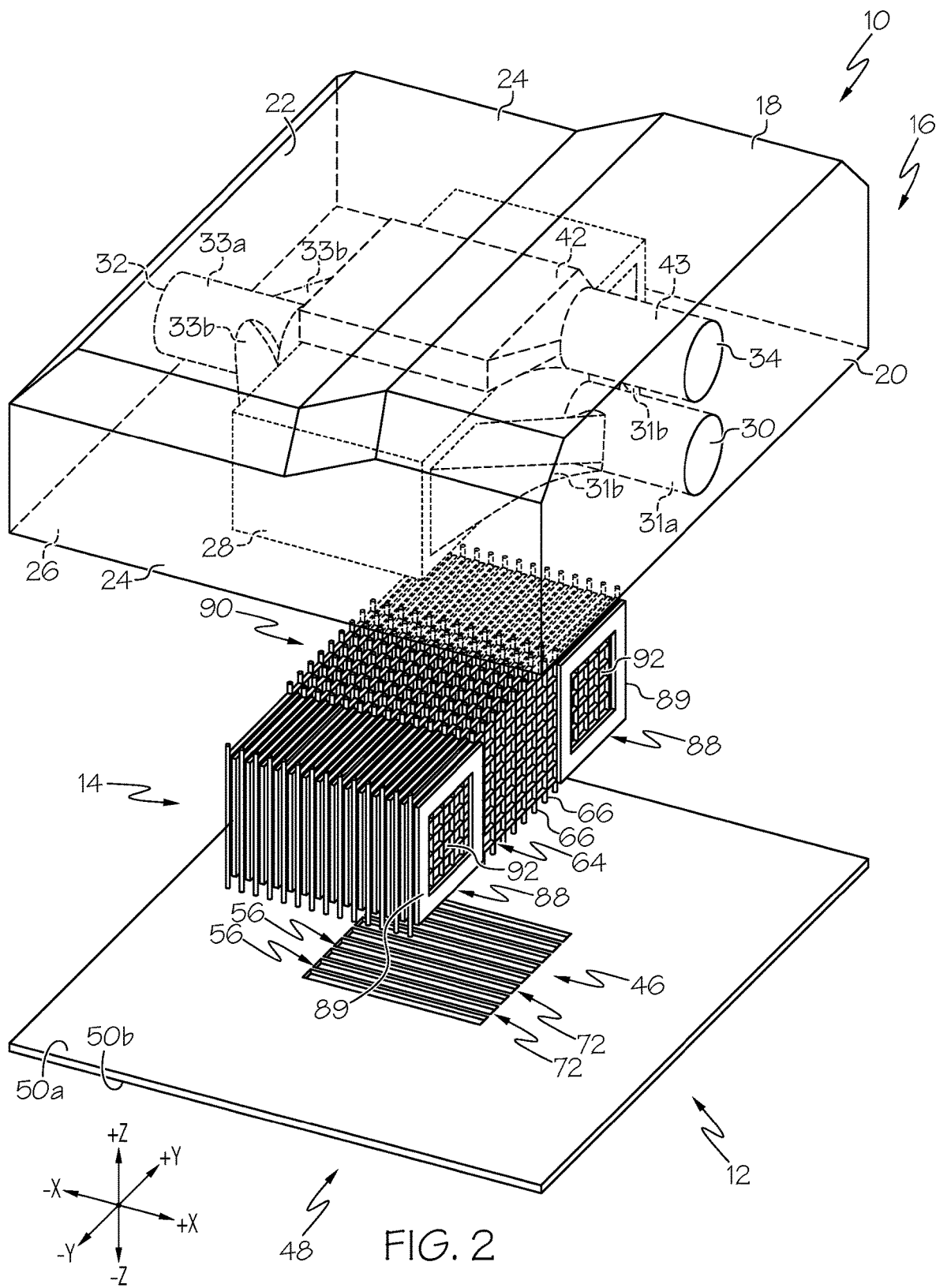
FIG. 2 schematically depicts a perspective exploded view of the μ-cooler assembly of FIG. 1 according to one or more embodiments shown or described herein.
Figure 3:
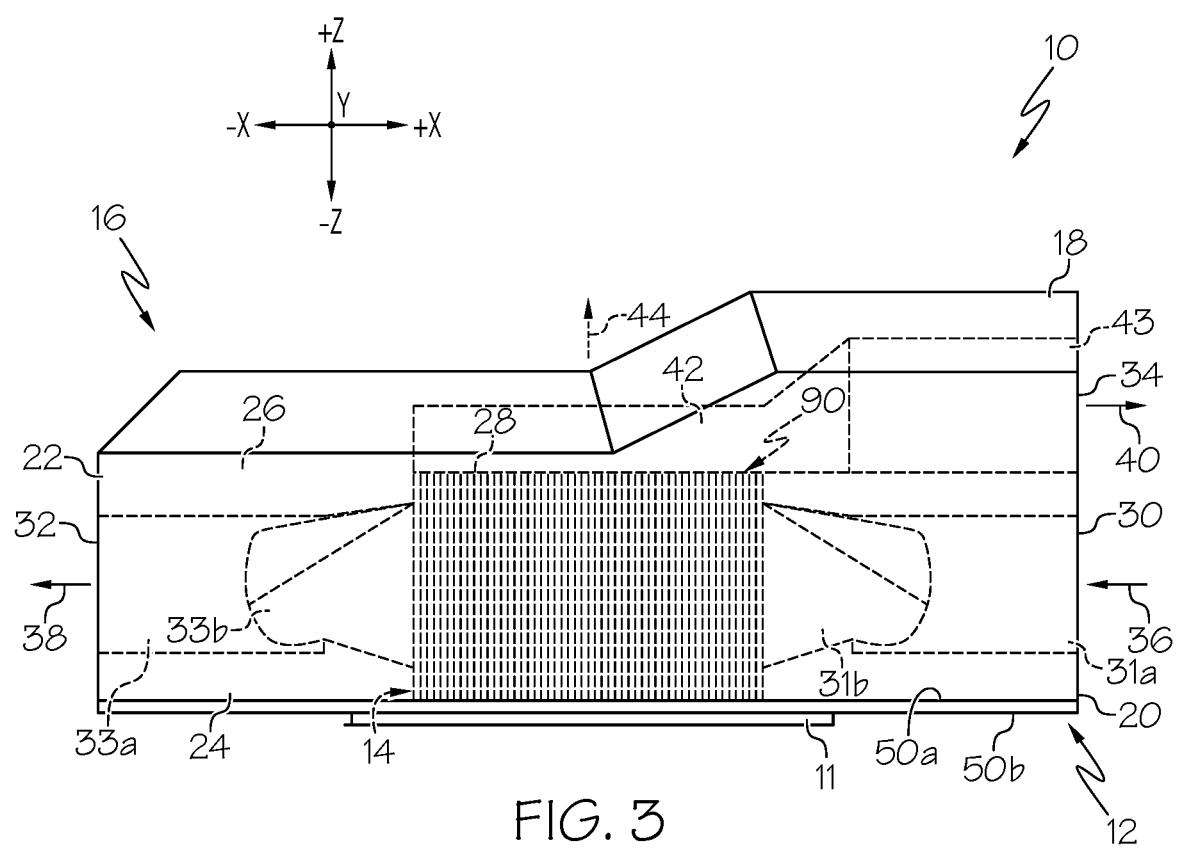
FIG. 3 schematically depicts a side view of the μ-cooler assembly of FIG. 1 according to one or more embodiments shown or described herein.
Figure 4:
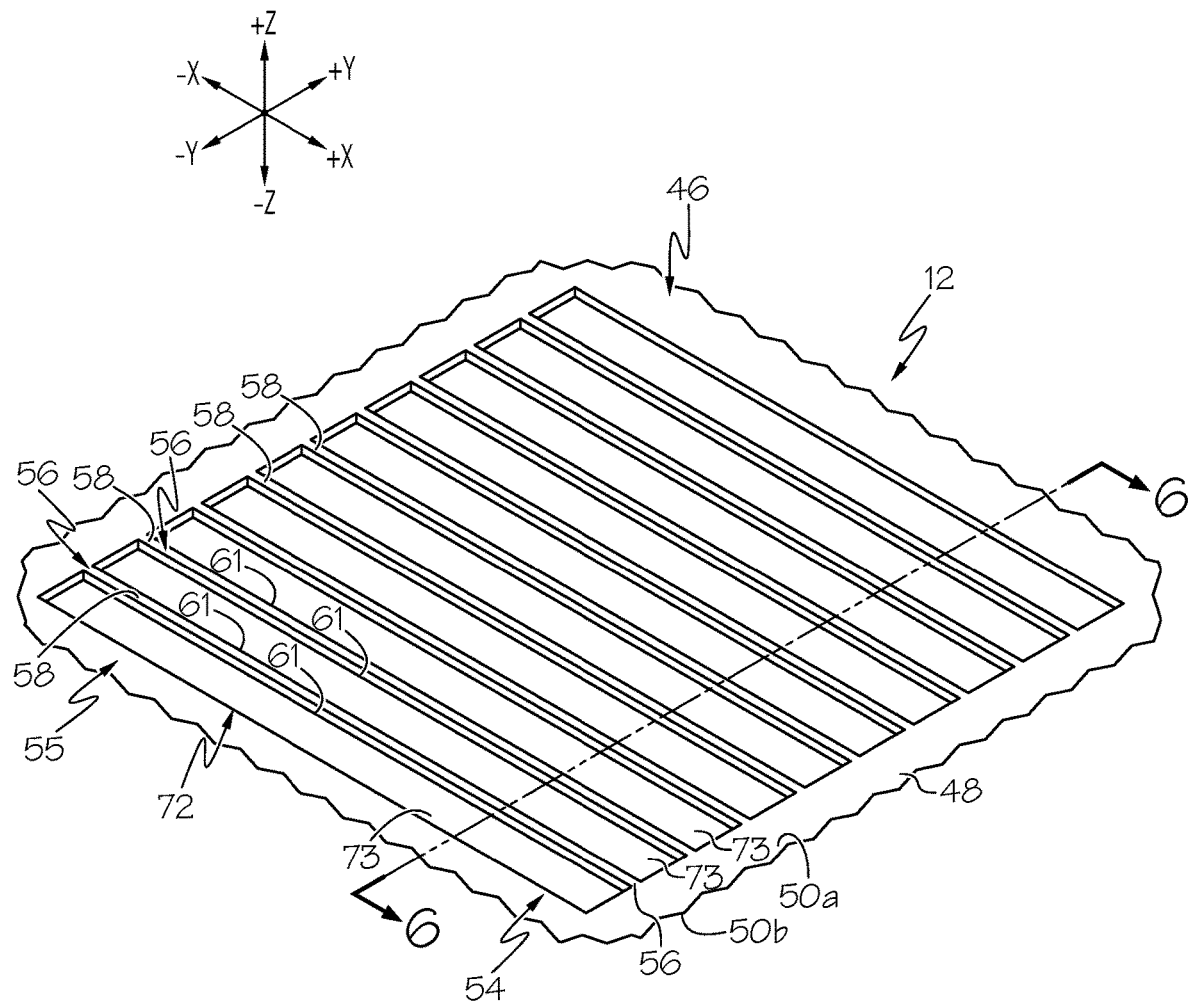
FIG. 4 schematically depicts a partially isolated perspective view of a support member of the μ-cooler assembly of FIG. 1 according to one or more embodiments shown or described herein.

Turning now to the figures, FIGS. 1-3 depict various schematic depictions of an example μ-cooler assembly 10. The μ-cooler assembly 10 may be a heat flux micro-cooler (μ-cooler) capable of removing, for example, a heat flux of power electronics device of 1000 W/cm$^2$ over a device size of 3 cm$^2$ with a temperature superheat of 20° C., and a thermal resistance of 0.02 cm$^2$-° C./W. In some embodiments, the μ-cooler assembly 10 may be known as an extreme heat flux micro-cooler (EHF μ-Cooler).

The example μ-cooler assembly 10 may include a cold plate 12, a manifold with wicking structure 14, and a manifold case 16. The manifold case 16 may act as a cover to enclose portions of the cold plate 12 and the manifold with wicking structure 14, as discussed in greater detail herein.

A heat-generating device 11 may be thermally coupled to the cold plate 12, as best depicted in FIG. 3. The heat-generating device 11 may be a central processing unit (CPU) or a graphics processing unit (GPU) that use integrated circuits and are commonly found and associated with data centers. Further, the heat-generating device 11 may be a power device that may include one or more semiconductor devices such as, but not limited to, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof. In some embodiments, the heat-generating device 11 may include a wide-bandgap semiconductor, and may be formed from any suitable material such as, but not limited to, silicon carbide (SiC), silicon dioxide (SiO$_2$), aluminum nitride (AlN), gallium nitride (GaN), and boron nitride (BN), and the like. In some embodiments, the heat-generating device 11 may include ultra-wide-bandgap devices formed from suitable materials such as AlGaN/AlN, Ga2O3, and diamond. In some embodiments, the heat-generating device 11 may operate within a power module having a high current and/or a high power and under high temperatures (for example, in excess of 100° C., 150° C., 175° C., 200° C., 225° C., or 250° C.) and dissipate a large amount of power in the form of heat that must be removed for the continued operation of the heat-generating device 11.

Accordingly, the heat-generating device 11 may be suitable in vehicle power electronics, in data center applications with integrated circuits, and the like. The heat generated by the heat-generating device 11 may be conducted away via the μ-cooler assembly 10 to cool the heat-generating device 11.

Still referring to FIGS. 1-3, the manifold case 16, as depicted, includes a top wall 18 (also referred to herein as the top surface). Further, the manifold case 16, as depicted, includes a first wall 20 (also referred to herein as the front surface) and an opposite second wall 22 (also referred to herein as the back surface), and a pair of side walls 24 positioned to extend between the first wall 20 and the second wall 22. Each of the first wall 20, the second wall 22, and the pair of side walls 24 extend from the top wall 18 in the vertical direction (i.e., in the +/−Z direction) to form a cavity 26 there between.

The manifold case 16 may be made of non-conductive material such as a plastic, a ceramic, or a composite material and may be formed via traditional methods such as injection molding, and/or may be formed via additive methods. The manifold case 16 is configured to cover, or enclose, the manifold with wicking structure 14 and at least portions of the cold plate 12, as discussed in greater detail herein. In particular, the manifold case 16 further includes a receiving recess 28 that is shaped dimensionally to receive the manifold with wicking structure 14 when the manifold case 16 is positioned to abut the cold plate 12, as best illustrated in FIGS. 1 and 3.

The manifold case 16 may include a fluid inlet 30 a fluid outlet 32, and at least one vapor outlet 34. The fluid inlet 30 may be configured to receive a liquid coolant, as depicted by the arrow labeled 36 in FIG. 3. Non-limiting example liquid coolants include dielectric cooling fluids such as deionized water, R-245fa, and HFE-7100. Other dielectric cooling fluids may be utilized. The type of dielectric cooling fluid chosen may depend on the operating temperature of the heat generating devices to be cooled.

Still referring to FIGS. 1-3, the fluid inlet 30 is fluidly coupled to the receiving recess 28 of the manifold case 16 via an inlet conduit 31a, which is in fluid communication with a pair of inlet fluid channels 31b that extend from the inlet conduit 31a. As such, in some embodiments, the liquid coolant 36 may be split between each of the pair of inlet fluid channels 3 lb. The fluid outlet 32 is configured to receive the liquid coolant 36 from the receiving recess 28 and/or the manifold with wicking structure 14 via a pair of outlet fluid channels 33b that extend from the receiving recess 28 and/or the manifold with wicking structure 14 and fluidly couple to an outlet conduit 33a. The outlet conduit 33a is in fluid communication with the fluid outlet 32. The now heated liquid coolant is expelled from the manifold case 16 via the fluid outlet 32, as depicted by the arrow labeled 38 in FIG. 3. The flow of the liquid coolant between being delivered to the receiving recess 28 and being dispensed from the receiving recess 28 will be described in more detail herein.

The at least one vapor outlet 34 may be positioned above the receiving recess 28 and the fluid inlet 30 in the vertical direction (i.e., in the +/−Z direction). That is, the at least one vapor outlet 34 may be positioned closer in proximity to the top wall 18 than the fluid inlet 30. As such, the at least one vapor outlet 34 may be fluidly isolated from the fluid inlet 30, the fluid outlet 32, the cold plate 12, the manifold with wicking structure 14 and vice versa.

Further, in this embodiment, the vapor, as depicted by the arrow labeled 40 in FIG. 3, may travel to exit the manifold case 16 in at least one direction that is traverse to the direction of the liquid coolant 36 entering the manifold case 16 via the fluid inlet 30. As such, the vapor 40 exiting the manifold with wicking structure 14 may follow a curvilinear or arcuate flow path, as discussed in greater detail herein. In embodiments, a vapor cavity 42 may be positioned directly above portions of the receiving recess 28. The vapor cavity 42 may be fluidly coupled to a vapor conduit 43, which is fluidly coupled to the at least one vapor outlet 34. Vapor may vertically enter the vapor cavity 42 prior to exiting the manifold case 16 via the vapor conduit 43 and the at least one vapor outlet 34.

In other embodiments, an additional at least one vapor outlet 34 is positioned to be fluidly coupled to the vapor cavity 42 such that the vapor may exit the manifold case 16 via the additional at least one vapor outlet 34, as depicted by the arrow labeled 44 in FIG. 3. It should be understood that in embodiments with the additional at least one vapor outlet 34 positioned to be fluidly coupled to the vapor cavity 42, the vapor conduit 43 may not be used by the additional at least one vapor outlet 34 and instead vapor may exit directly from the vapor cavity 42. It should also be understood that in some embodiments, the vapor cavity 42 and both the vertical exit and the at least one vapor outlet 34 may be utilized to expel vapor transported from within the manifold with wicking structure 14 and/or the receiving recess 28 out of the manifold case 16.

Now referring to FIGS. 2, 5-6, and 8A-8B, the manifold with wicking structure 14 includes a plurality of layers that alternate between spacer element layers 88 and mesh layers 90. The spacer element layers 88 each include a pair of spacer elements 89 that each include an opening 92.

Each mesh layer 90 includes an upper frame 62a and an opposite lower frame 62b and a pair of side frames 62c that connects the upper frame 62a to the lower frame 62b to form a rectangular mesh layer. A plurality of mesh pores 64 are positioned between the upper frame 62a and the lower frame 62b and the pair of side frames 62c to form a liquid channel. A plurality of stake members 66 extend from each of the upper frame 62a and the lower frame 62b. Note that the mesh layer 90 may take an alternative configuration (not shown) where the mesh pores 64 extend fully between the upper frame 62a, lower frame 62b, and two side frames 62c.

The spacer element layer 88 includes the pair of spacer elements 89 that each have the corresponding opening 92. Each of the spacer element layers 88 are positioned to be in contact with a respective one of the pair of side frames 62c (or full mesh layer 90 in the alternative configuration). That is, each of the pair of spacer elements 89 abut or are in contact with a portion of the respective one of the pair of side frames 62c. Further, the spacer elements 89 have a thickness such that the spacer element layer 88 creates a gap, or spaces apart, each consecutive mesh layer 90 in the longitudinal direction (i.e., in the +/−X direction). As best illustrated in FIG. 2, portions of the mesh layers 90 that include a plurality of mesh pores 64 are in contact with the support member 46, while portions of the spacer element layers 88 are in contact with the upper surface 50a of a bonding portion 48 of the cold plate 12, as discussed in greater detail herein.

Still referring to FIGS. 2, 5-6, and 8A-8B, the plurality of layers (e.g., alternating between the spacer element layer 88 and the mesh layer 90) are stacked in the longitudinal direction (i.e., in the +/−X direction) such that the openings 92 of the spacer element layer 88 are axially aligned but offset from one another in the longitudinal direction (i.e., in the +/−X direction) by a thickness of the mesh layers 90. Each of the spacer element layers 88 abut the next, or adjacent, mesh layer 90, and so on, in the longitudinal direction (i.e., in the +/−X direction) and each mesh layers 90 is spaced apart by the thickness of the spacer elements 89. In a non-limiting example, the spacer element layer 88 creates a 600 micron gap between the next layer layers. It should be understood that this is non-limiting and that the gap between layers may be less than or greater than 600 microns.

The size of the opening 92 of the spacer elements 89 may be dependent on the amount of liquid coolant desired to be wicked to a substrate 51 and/or pass through to the fluid outlet 32, as discussed in greater detail herein. Further, in some embodiments, the size of the opening 92 of the spacer elements 89 may be uniform. In other embodiments, the size of the opening 92 of the spacer elements 89 may be non-uniform. That is, the size may vary between spacer elements 89, may vary between groups of spacer elements 89, combinations thereof, and the like. Further, while the opening 92 of the spacer elements 89 is depicted as having a generally square shape, this is non-limiting and the opening may be circular, octagonal, hexagonal, rectangular, combinations thereof, and/or the like.

Each mesh layer 90 includes the plurality of mesh pores 64. The size of the opening of the plurality of mesh pores 64 may be dependent on the amount of liquid coolant desired to be wicked to the substrate 51 and/or pass through to the fluid outlet 32. In a non-limiting example, the size of the plurality of mesh pores 64 are 250 microns. It should be understood that this is non-limiting and that the size of the plurality of mesh pores 64 may be less than or greater than 250 microns.

Further, in some embodiments, the sizes of each of the plurality of mesh pores 64 may be uniform. In other embodiments, the size of each of the plurality of mesh pores 64 may be non-uniform when fabricated using an additive process. That is, the size of each of the plurality of mesh pores 64 may vary between mesh layers, may vary between groups of mesh layers, may vary on a single mesh layer, combinations thereof, and the like. Further, while the plurality of mesh pores 64 are depicted has having a generally square shape, this is non-limiting and each of the plurality of mesh pores may be circular, octagonal, hexagonal, rectangular, random due to particle sintering (within some specific hydraulic diameter range), combinations thereof, and/or the like.

It should further be appreciated that, in some embodiments, each mesh layer 90 may be sized such that the plurality of mesh pores 64 extend into the opening 92 of the spacer elements 89. Further, it should be appreciated that each opening 92 of the spacer elements 89 may be interconnected by a material when fabricated using an additive process, for example. In other embodiments, each mesh layer 90 may be sized such that the plurality of mesh pores 64 do not extend into the opening 92 of the spacer elements 89.

Figure 8A:
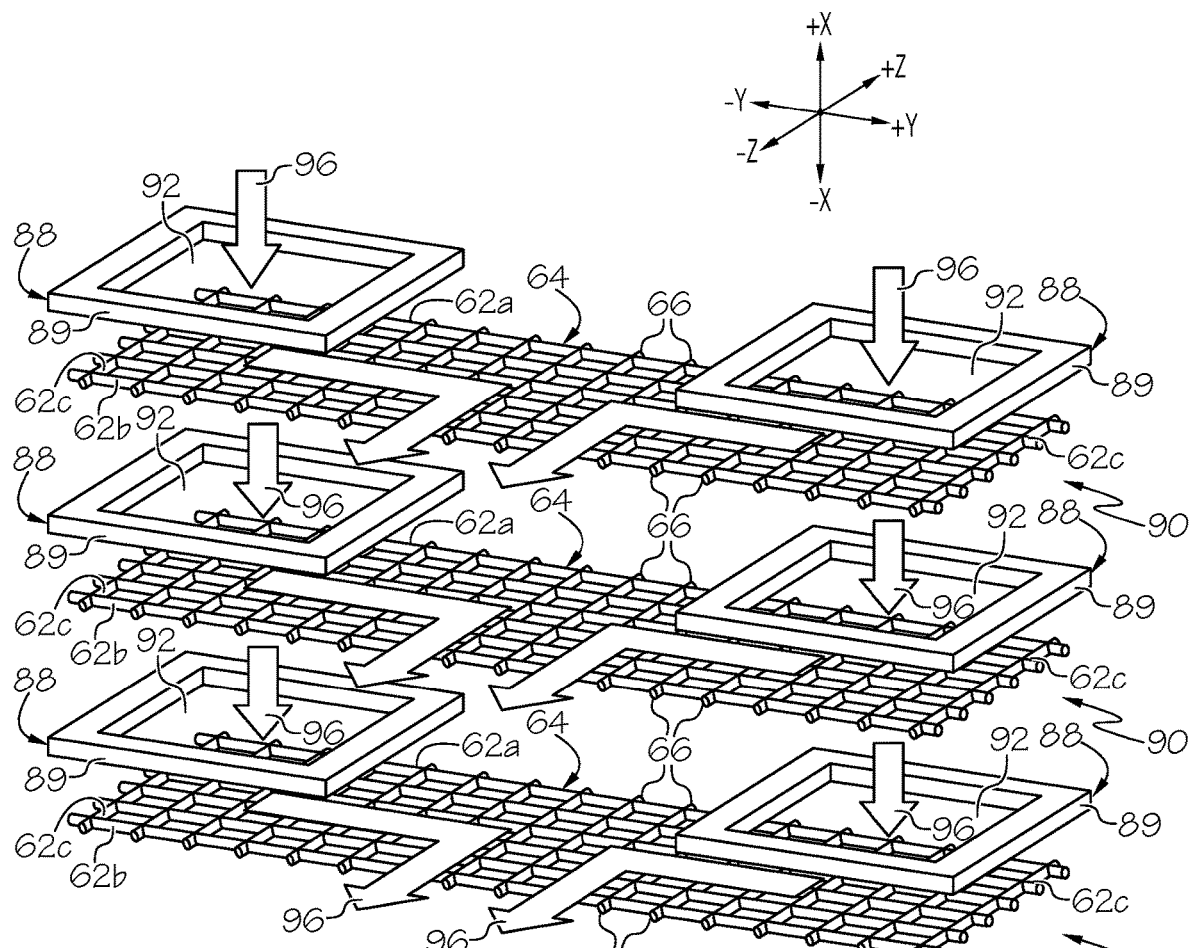
FIG. 8A schematically depicts a partially isolated exploded perspective view of a manifold wicking structure and liquid coolant capillary action rotated 90 degrees of the μ-cooler assembly of FIG. 1 according to one or more embodiments shown or described herein.

Now referring to FIGS. 2-3 and 8A-8B, it should be understood that the plurality of mesh pores 64 of each of the mesh layers 90 together form a plurality of micro fluid delivery channels or pathways, illustrated by the arrows 96 in FIG. 8A. That is, portions of the liquid coolant 36 is wicked along the plurality of mesh pores 64 toward the cold plate 12. The opening 92 of the spacer elements 89 and the spacer element layer 88 itself also enable the liquid coolant 36 to flow laterally, vertically and/or longitudinally through the μ-cooler assembly 10. In particular, the pair of inlet fluid channels 31b are fluidly coupled to the openings 92 of the spacer elements 89 and as the liquid coolant 36 enters the fluid inlet 30, the pair of inlet fluid channels 31b direct the liquid coolant 36 into the manifold with wicking structure 14. The liquid coolant 36 is then wicked, via a capillary action, through and around the plurality of mesh pores 64 of the mesh layers 90 and through the gaps formed from the spacer elements 89 and into the substrate 51 where an array of fluid channels 54 with secondary MIO wick that receives the liquid coolant 36, as discussed in greater detail herein.

Figure 8B:
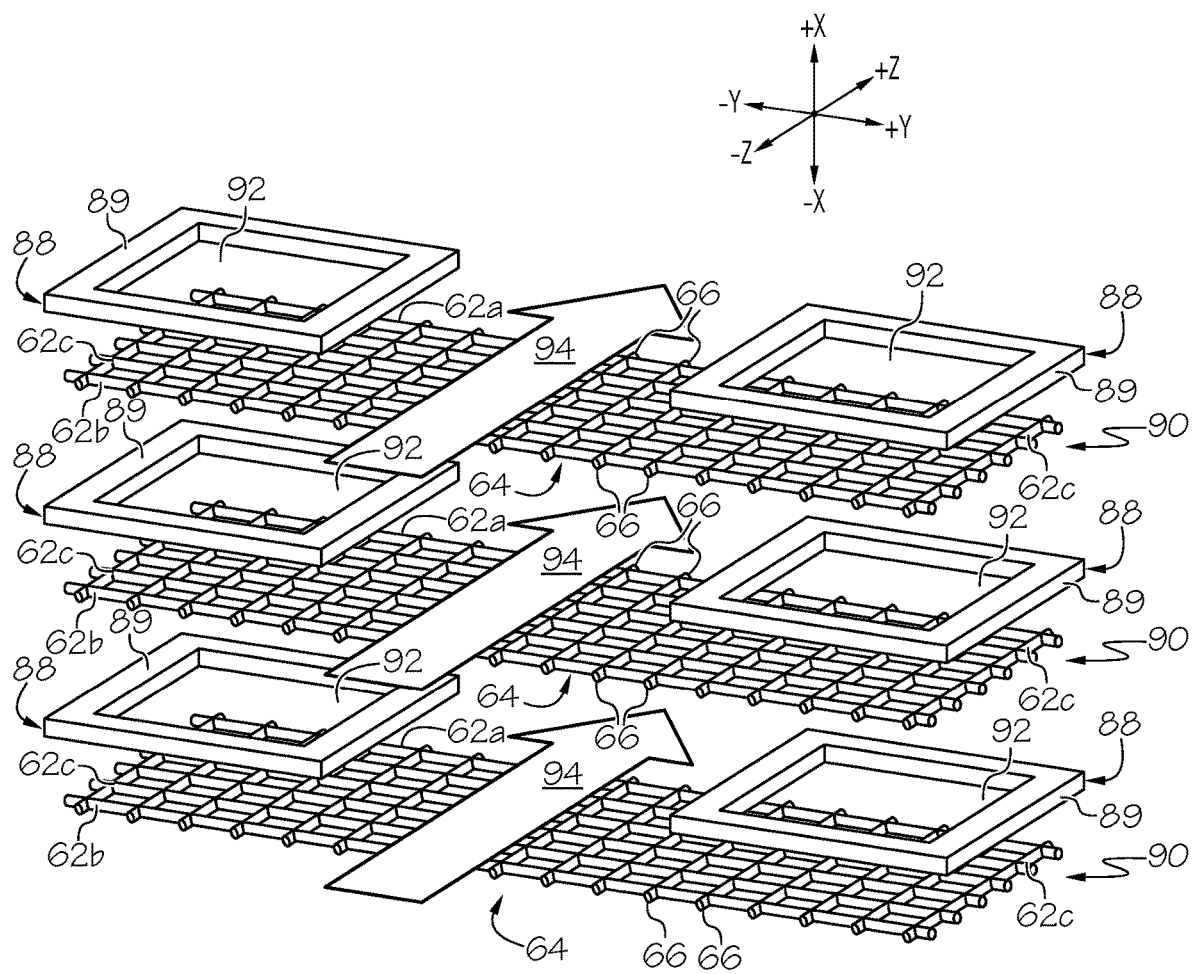
FIG. 8B schematically depicts a partially isolated exploded perspective view of the manifold wicking structure of FIG. 8A according to one or more embodiments shown or described herein.

Vapor, illustrated by arrow 94 in FIG. 8B, also flows vertically (i.e., in the +/−Z direction) between the gaps, or spaces, of the mesh layers 90 created by the spacer elements 89 of the spacer element layers 88 toward and into the vapor cavity 42 (e.g., as vapor 40 and 44 illustrated in FIG. 3). It should be appreciated that the plurality of mesh pores 64, the space or gap between the mesh layers 90, and the like, may be graded (i.e., varied) to provide a customized fluid flow.

Each of the mesh layers 90 may be a metal, such as copper (Cu), aluminum (Al), nickel (Ni), iron (Fe), zinc (Zn), alloys thereof, and the like. As used herein, the term "alloys thereof" refers to alloys not limited to the elements listed unless otherwise stated. For example, a Cu alloy as disclosed herein may include an alloy formed from Cu and elements other than Al, Ni, Fe, and Zn. In the alternative, a Cu alloy as disclosed herein may include an alloy formed from Cu with Al, Ni, Fe and/or Zn, plus additional elements. In another alternative, a Cu alloy as disclosed herein may include an alloy formed from only Cu and Al, Ni, Fe and/or Zn plus any incidental impurities present from manufacturing of the Cu alloy. The mesh layers 90 may also be formed of silicon, AlSiC (metal-matrix composite), or a ceramic.

Each of the spacer elements 89 and/or the spacer element layers 88 may be a metal, such as copper (Cu), aluminum (Al), nickel (Ni), iron (Fe), zinc (Zn), alloys thereof, and the like. As used herein, the term "alloys thereof" refers to alloys not limited to the elements listed unless otherwise stated. For example, a Cu alloy as disclosed herein may include an alloy formed from Cu and elements other than Al, Ni, Fe, and Zn. In the alternative, a Cu alloy as disclosed herein may include an alloy formed from Cu with Al, Ni, Fe and/or Zn, plus additional elements. In another alternative, a Cu alloy as disclosed herein may include an alloy formed from only Cu and Al, Ni, Fe and/or Zn plus any incidental impurities present from manufacturing of the Cu alloy. The spacer element layers 88 may also be formed of silicon, AlSiC (metal-matrix composite), a ceramic, and/or polymers such as polyimide. In some embodiments, the entire manifold with wicking structure 14, including the spacer elements 89 and the mesh layers 90, may be additively manufactured using the same material composition to facilitate a graded design.

Now referring to FIGS. 2 and 4-6, the cold plate 12 will be described. The cold plate 12 may include the support member 46 and the bonding portion 48. In some embodiments, the bonding portion 48 may be a region that surrounds the support member 46. It should be appreciated that the cold plate 12 may be formed by etching a silicon wafer or by micromachining a Cu substrate. As such, in some embodiments, the cold plate 12 may be a silicon material. In other embodiments, the cold plate 12 may Cu, AlSiC, or other materials.

The bonding portion 48 may include an upper surface 50a and an opposite lower surface 50b. The upper surface 50a may be in contact with, or abut, the manifold case 16. That is, the upper surface 50a may be planar and provide a mounting or coupling surface for the manifold case 16 to rest on, abut, or bond onto, as discussed in greater detail herein. In some embodiments, portions of the lower surface 50b may be coupled to the heat-generating device 11.

The support member 46 includes the substrate 51 that may be positioned to extend from the heat-generating device 11 in the vertical direction (i.e., in the +/−Z direction). The substrate may include an inner surface 57a and an outer surface 57b spaced apart from the inner surface 57a to define a thickness. In some embodiments, the inner surface 57a of the substrate 51 may be bonded to the heat-generating device 11 via a thermal interface layer 52. The thermal interface layer 52 may include an upper surface 53b and an opposite lower surface 53a that define a thickness. The lower surface 53a may be in contact with the heat-generating device 11 and the upper surface 53b may be in contact with the inner surface 57a of the substrate 51. The thermal interface layer 52 may comprise a thermally conductive bond and may include a DBC (direct bonded copper) substrate, solder, or some other high temperature substrate, bonding material, or method. In other embodiments, the thermal interface layer 52 may be a thermal grease positioned between the substrate 51 and heat-generating device 11.

The substrate 51 includes the array of fluid channels 54 that and an array of bonding posts 56 that form a plurality of multi-stepped features 55. The array of bonding posts 56 each have a pair of spaced apart sidewalls 61 and an upper surface 58 extending between the pair of sidewalls 61. The pair of sidewalls 61 extend in the vertical direction (+/−Z direction) and in a direction that is orthogonal to the array of fluid channels 54. That is, the array of bonding posts 56 may extend in the longitudinal direction (i.e., in the +/−X direction) while the array of fluid channels 54 may extend in the lateral direction (i.e., in the +/−Y direction). As such, the array of fluid channels 54 and the array of bonding posts 56 may form a rectangular grid. This is non-limiting and the grid may be square, hexagonal, octagonal, circular, triangular, and/or the like.

Each of the bonding posts 56 has a height H1 extending from the upper surface 58 of each of the bonding posts 56 to the inner surface 57a of the substrate 51 in the vertical direction (i.e., in the +/−Z direction). Each of the fluid channels 54 include a height H2 extending from the inner surface 57a of the substrate 51 to a trench surface 73 of the each fluid channel of the array of fluid channels 54 of the substrate 51. The height H2 is less than the height H1 such that the array of bonding posts 56 extend above the array of fluid channels in the vertical direction (i.e., in the +/−Z direction). As such, a portion of the bonding posts 56 form walls orthogonal to the array of fluid channels 54 such that the liquid coolant is retained in and along at least the trench surface 73 of a trench 72 of the array of fluid channels 54, as discussed in greater detail herein. As such, the array of fluid channels 54 with the height H2 and the array of bonding posts 56 with a height H1 define the multi-stepped features 55 of the substrate 51.

In some embodiments, the upper surface 58 of each of the array of bonding posts 56 may be planar and adopted to receive a portion of the plurality of stake members 66 of the mesh layers 90 of the manifold with wicking structure 14. In other embodiments, the upper surface 58 may be concave, include receiving portions, and the like, that are adapted to receive a portion of the plurality of stake members 66. It should be understood that each one of the plurality of stake members 66 for each mesh layer 90 extend a length of the corresponding bonding posts 56 in the longitudinal direction (i.e., in the +/−X direction). As such, each mesh layer 90 of the manifold with wicking structure 14 also extend in a direction orthogonal to the array of fluid channels 54.

In some embodiments, portions of the plurality of stake members 66 may be bonded to the upper surface 58 of the array of bonding posts 56 via electro-less plating or some other high temperature capable bonding method. In other embodiments, the plurality of stake members 66 may be positioned to rest or abut the upper surface 58 of the array of bonding posts 56 without permanent bond. In this embodiment, the mesh layers 90 of the manifold with wicking structure 14 are not bonded to the cold plate 12. Instead, the receiving recess 28 aligns and maintains the position of the manifold with wicking structure 14 with respect to the support member 46. As such, in this embodiment, the manifold case 16 is attached or coupled to the cold plate 12 in a fluid tight connection. In some embodiments, the manifold case 16 may be secured using a gasket (not shown) or may be bonded to the cold plate 12 via a plastic welding, adhesives, epoxy, solder and/or some other high temperature capable bonding method.

The thickness of the substrate 51 and cold plate 12 may depend on the intended use of the μ-cooler assembly 10. That is, the thickness may vary depending on whether the heat-generating device 11 (FIG. 3) is an integrated circuit CPU/GPU or a power electronic semiconductor. As such, the illustrated embodiments and present disclosure are non-limiting as the thickness of the substrate 51 and/or cold plate 12 varies.

Figure 5:
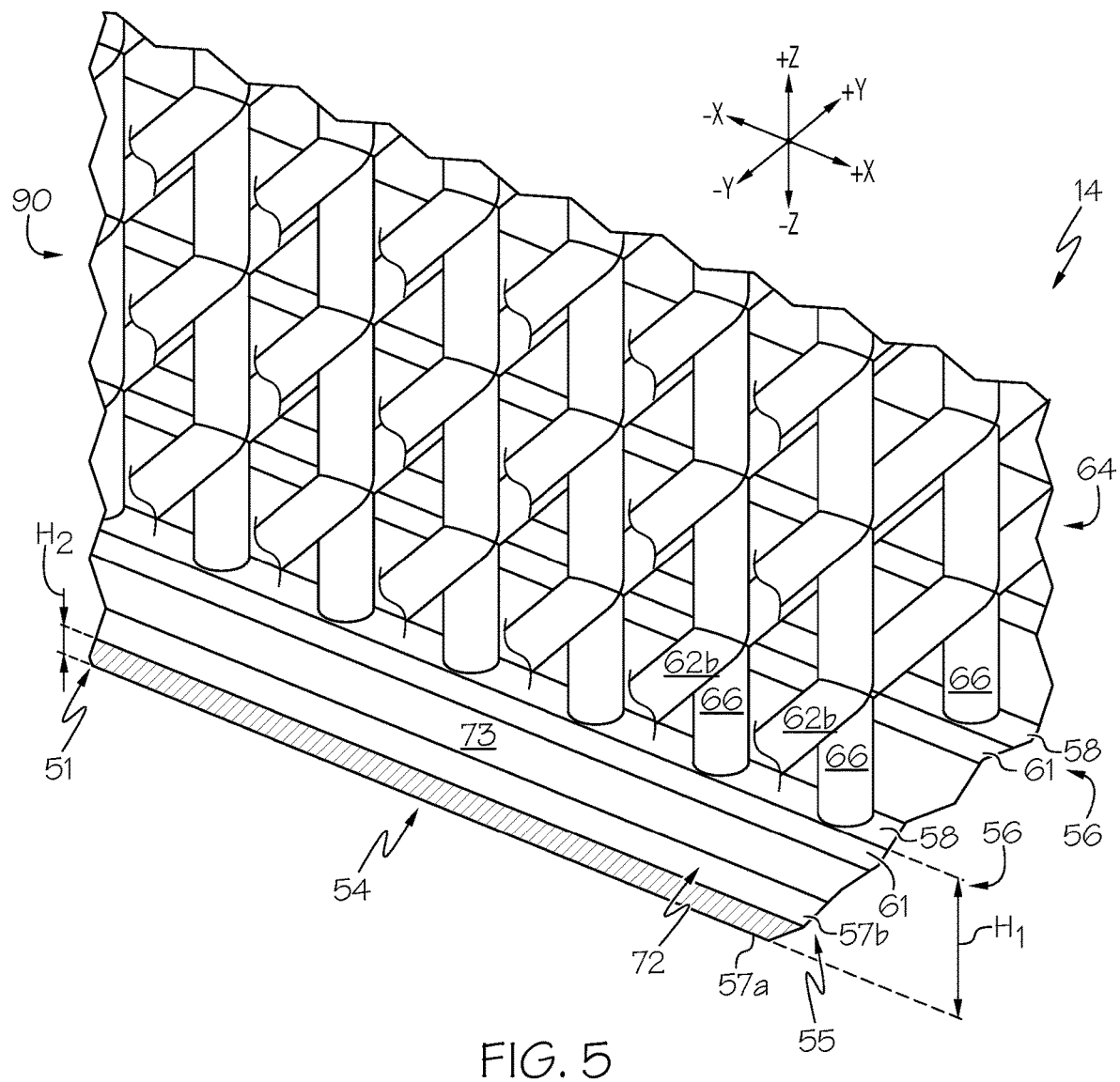
FIG. 5 schematically depicts a partially isolated perspective view of the support member of the μ-cooler assembly of FIG. 4 including a manifold wicking structure in an assembled state according to one or more embodiments shown or described herein.
Figure 6:
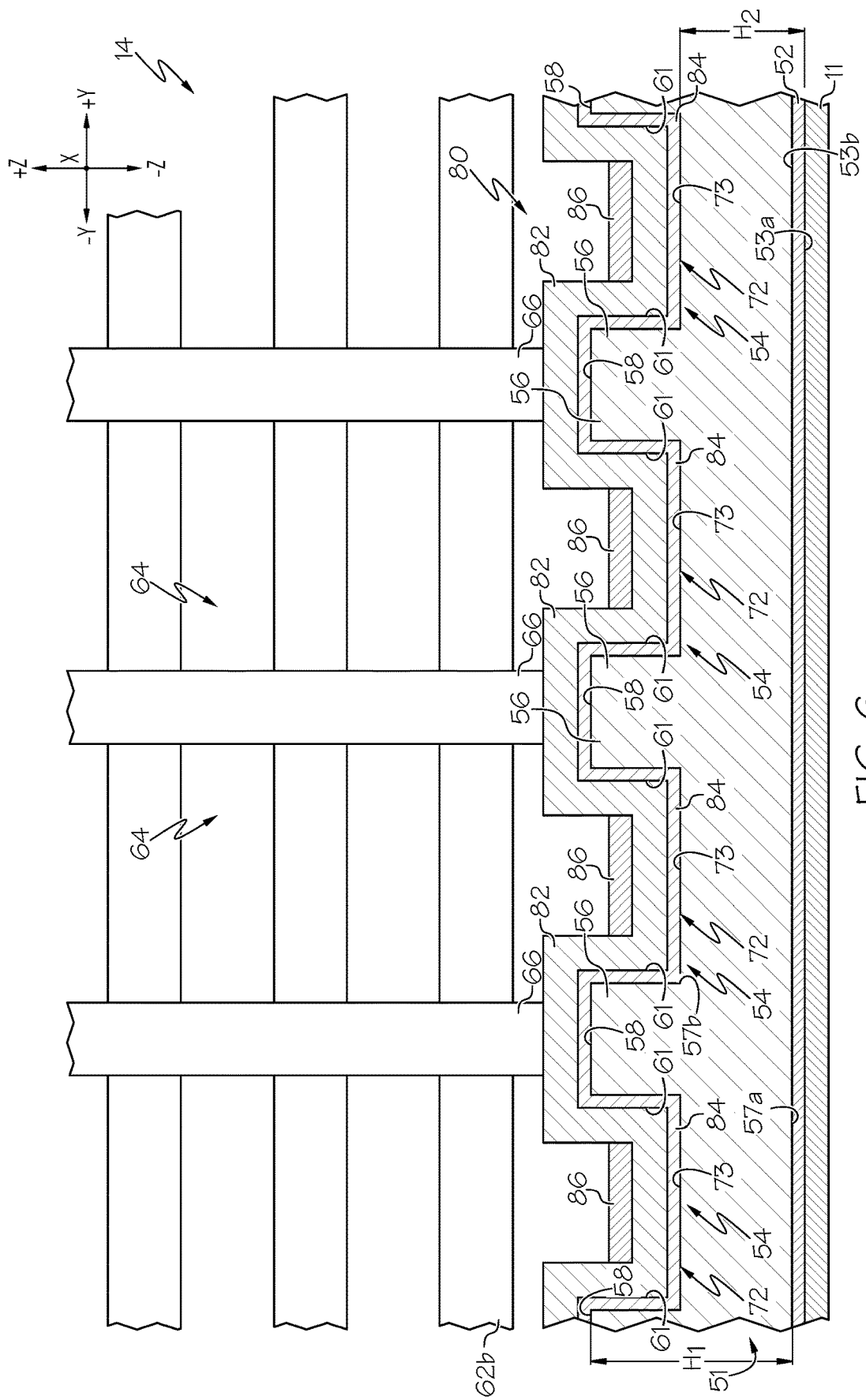
FIG. 6 schematically depicts a partially cross sectional view of the support member of the μ-cooler assembly of FIG. 4 taken from line 6-6 including a wicking structure in an assembled state according to one or more embodiments shown or described herein.
Figure 7:
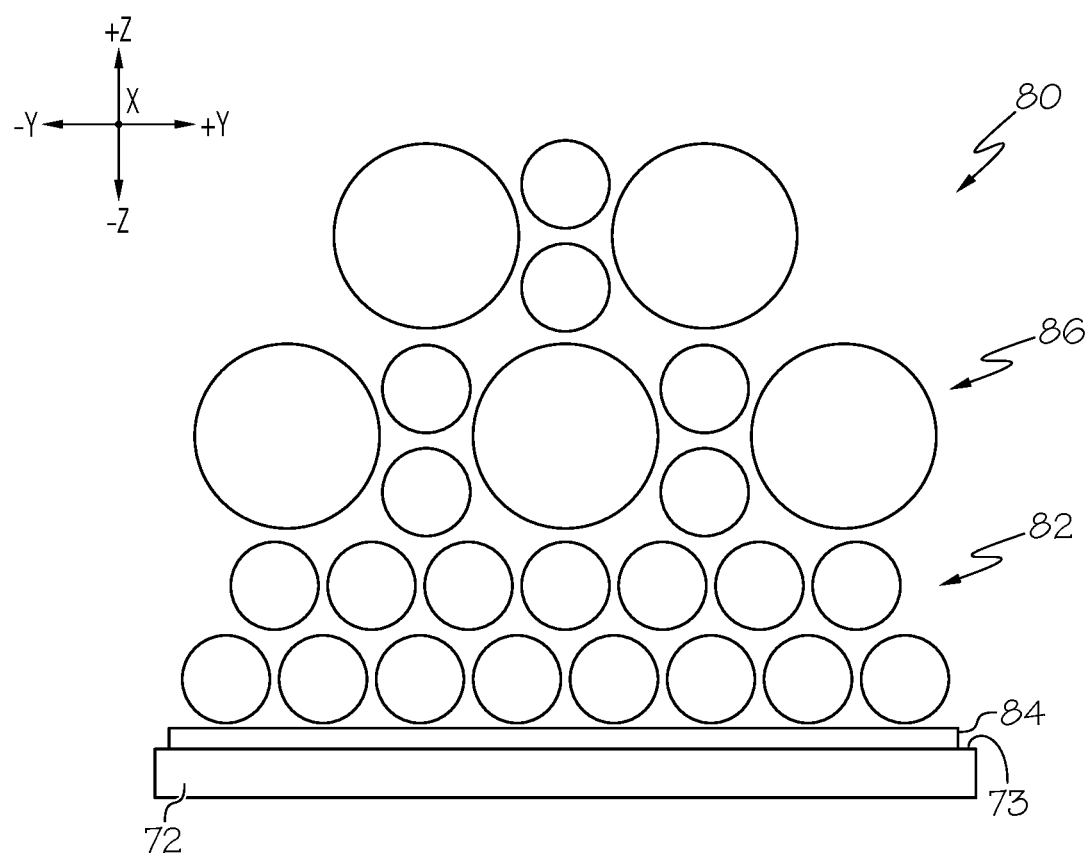
FIG. 7 schematically depicts a partially isolated perspective view of a metal inverse opal bonding structure of the μ-cooler assembly of FIG. 1 according to one or more embodiments shown or described herein.

Now referring to FIGS. 5-7, each trench 72 includes the trench surface 73. In some embodiments, the trench surface 73 may be planar and extends in the lateral direction (i.e., in the +/−Y direction) between adjacent sidewalls 61 of the bonding posts of the array of bonding posts 56. In other embodiments, the trench surface 73 may be arcuate, curvilinear, concave, convex, and/or other shapes. A metal inverse opal (MIO) secondary wicking structure 80 is positioned along the trench surface 73 and may be positioned along the sidewalls 61 and along the upper surface 58 of the array of bonding posts 56. The MIO secondary wicking structure 80, along with the trench surface 73 of the plurality of trenches 72 and the sidewalls 61 are in fluid communication with the liquid coolant 36 (FIG. 3) that is wicked via a capillary action from the manifold with wicking structure 14 into the array of fluid channels 54, as discussed in greater detail herein. As such, the MIO secondary wicking structure 80 and the plurality of multi-stepped features 55 may provide nucleation sites for enhanced two-phase heat transfer using the liquid coolant 36 (FIG. 3), as discussed in greater detail herein.

Additionally, the MIO secondary wicking structure 80 may provide a thermally conductive cooling layer for the substrate 51 such that the liquid coolant 36 (FIG. 3) may enter the substrate 51 and flow through the porous structure of the MIO secondary wicking structure 80, and in particular, through the interconnected voids defined within the MIO secondary wicking structure 80, to cool the substrate and/or the heat-generating device 11, as discussed in greater detail herein. The MIO secondary wicking structure 80 may further provide a thermal stress compensation layer to the substrate 51 to reduce thermally-induced stresses due to CTE mismatch without the need for additional interface layers. Various embodiments of the MIO secondary wicking structures will be described in greater detail herein.

The MIO secondary wicking structure 80 may generally be any inverse opal structure, such as, for example, a copper inverse opal (CIO) structure, a nickel inverse opal (NIO) structure, and/or the like. The MIO secondary wicking structure 80 has a plurality of MIO pores 82 or voids that define a porosity of the MIO secondary wicking structure 80. The plurality of MIO pores 82 may facilitate a thermal conductivity, porosity, and permeability for the MIO secondary wicking structure 80.

Still referring to FIGS. 5-7, a seed layer 84 may extend across and within the array of fluid channels 54 and the array of bonding posts 56 to include the sidewalls 61 and/or the upper surface 58. In some embodiments, the seed layer 84 may extend from the various structures of the substrate 51 in the various directions, such as from the trench surface 73 in the vertical direction (i.e., in the +/−Z direction) 5 micrometers and from the pair of sidewalls 61 in the lateral direction (i.e., in the +/−Y direction) 5 micrometers. This is non-limiting and the seed layer 84 may extend in the vertical direction (i.e., in the +/−Z direction), the lateral direction (i.e., in the +/−Y direction) and/or the longitudinal direction (i.e., in the +/−X direction). Further, the seed layer 84 may extend in the vertical direction (i.e., in the +/−Z direction), the lateral direction (i.e., in the +/−Y direction) and/or the longitudinal direction (i.e., in the +/−X direction) more than or less than 5 micrometers. In some embodiments, the seed layer 84 may be a metal. In other embodiments, the seed layer 84 may be formed or comprise other materials suitable for electro-plating.

As such, the seed layer 84 may allow for growth (electro-plating) of the plurality of MIO pores 82 of the MIO secondary wicking structure 80. Further, the plurality of MIO pores 82 may extend uniformly from the seed layer 84 and onto the trench 72, each of the pair of sidewalls 61 and/or the upper surface 58 of each of the array of bonding posts 56. In particular, the plurality of MIO pores 82 may extend uniformly along the trench surface 73 of the trench 72, each of the pair of sidewalls 61 and the upper surface 58 of each of the array of bonding posts 56. As such, the MIO secondary wicking structure 80 is positioned along the trench surface 73 of the trench 72, each of the pair of sidewalls 61 and the upper surface 58 of each of the array of bonding posts 56.

Each of the plurality of MIO pores 82 or voids may be organized so to have a uniform diameter and be stacked in the vertical direction (i.e., in the +/−Z direction). As such, the plurality of MIO pores 82 may be near, adjacent to, or in contact with the outer surface 57b of the substrate 51. In particular, the plurality of MIO pores 82 may be near, adjacent to, or in contact with the trench surface 73 of the trench 72 and each of the pair of sidewalls 61 and upper surface 58 of each of the array of bonding posts 56. In some embodiments, the plurality of MIO pores 82 or voids extend from the trench surface 73 of the trench 72 and each of the pair of sidewalls 61 and upper surface 58 of each of the array of bonding posts 56 in the vertical direction (i.e., in the +/−Z direction), the lateral direction (i.e., in the +/−Y direction) and/or the longitudinal direction (i.e., in the +/−X direction) 30 micrometers. This is non-limiting and the plurality of MIO pores 82 or voids extend in the vertical direction (i.e., in the +/−Z direction), the lateral direction (i.e., in the +/−Y direction) and/or the longitudinal direction (i.e., in the +/−X direction) more than or less than 30 micrometers.

Still referring to FIGS. 5-7, in some embodiments, the MIO secondary wicking structure 80 includes a second plurality of MIO pores 86 extending in the trench 72. The second plurality of MIO pores 86 may be graded to include larger pores or voids than those of the plurality of MIO pores 82. The second plurality of MIO pores 86 may be spaced apart with at least one pore sized and shaped similar to the first plurality of MIO pores 82 positioned in each of the spaces between the second plurality of MIO pores 86. The second plurality of MIO pores 86 may be stacked on the plurality of MIO pores 82 in the vertical direction (i.e., in the +/−Z direction) such that the smaller diameter pores of the plurality of MIO pores 82 are near, adjacent to, or in contacted with the trench surface 73 of the trench 72 while the second plurality of MIO pores 86, which are larger diameter pores, are stacked on the smaller pores of the plurality of MIO pores 82 in the vertical direction (i.e., in the +/−Z direction). Further, the at least one pore sized and shaped similar to the first plurality of MIO pores 82 positioned in each of the spaces between the second plurality of MIO pores 86 are also stacked on the similarly shaped pores of the plurality of MIO pores 82 in the vertical direction (i.e., in the +/−Z direction).

That is, both the second plurality of MIO pores 86 and the at least one pore sized and shaped similar to the first plurality of MIO pores 82 may be present in an upper portion of the MIO secondary wicking structure 80 with respect to the trench surface 73 and the plurality of MIO pores 82 may be present at a lower portion of the MIO secondary wicking structure 80 to be in contact with the seed layer 84 of the substrate 51. As such, the second plurality of MIO pores 86 of the MIO secondary wicking structure 80 may be graded in the vertical direction (i.e., in the +/−Z direction).

The number of pores and/or other surface features present in the first plurality of MIO pores 82 of the MIO secondary wicking structure 80 is not limited by the present disclosure, and may be any number. Further, the porosity gradient may vary depending on the heat generated from the heat-generating device 11. Further, while the plurality of MIO pores 82 are depicted as being generally spherical in shape, this is merely illustrative. Accordingly, it should be understood that the plurality of MIO pores 82 may be any shape, including, for example, spherical, cylindrical, and/or irregular shapes. The shape of the MIO pores 82 may be determined from the shape of the materials used to form the MIO secondary wicking structure 80 (i.e., the template for the metal deposition). Further, the thickness of the MIO secondary wicking structure 80 is not limited by the present disclosure, and may generally be any thickness.

The number of pores present in the second plurality of MIO pores 86 and/or other surface features present in the MIO secondary wicking structure 80 is not limited by the present disclosure, and may be any number. Further, the porosity or permeability gradient may vary depending on the heat generated from the heat-generating device 11. Further, while the second plurality of MIO pores 86 are depicted as being generally spherical in shape, this is merely illustrative. Accordingly, it should be understood that the second plurality of MIO pores 86 may be any shape, including, for example, spherical, cylindrical, and/or irregular shapes. The second plurality of MIO pores 86 may be determined from the shape of the materials used to form the MIO secondary wicking structure 80 (i.e., the template for metal deposition). Further, the thickness of the MIO secondary wicking structure 80 is not limited by the present disclosure, and may generally be any thickness.

Still referring to FIGS. 5-7, as briefly described above, the MIO secondary wicking structure 80 may generally be constructed of a thermally conductive material, but is otherwise not limited by the present disclosure. In some embodiments, the material used for the MIO secondary wicking structure 80 may be selected based on the process used to form the MIO secondary wicking structure 80, as described in greater detail herein. For example, if the MIO secondary wicking structure 80 is formed from an MIO formation process, metals that are suitable for such a formation process may be used. Illustrative examples of materials that may be used include, but are not limited to, aluminum, nickel, copper, silver, gold, an alloy containing any of the foregoing, a compound containing any of the foregoing, and the like. Other materials that are generally understood to result from an inverse opal formation process that are not specifically disclosed herein are also included within the scope of the present disclosure.

It should be understood that inverse opal structures (including the MIO secondary wicking structure 80) have a high permeability, as inverse opal wick structures provide the advantage of improved control over pore sizes and distribution. Accordingly, the permeability of the MIO secondary wicking structure 80 may be varied. In some embodiments, the MIO secondary wicking structure 80 is further configured to provide heat flux thermal management within the μ-cooler assembly 10 such that the MIO secondary wicking structure 80 may improve heat exchange between the heat-generating device 11 and the cold plate 12 at a high heat removal rate. Further, it should be understood that the varying pore sizes of the MIO secondary wicking structure 80 increases a wicking length, increases critical heat flux, and can assist to accommodate for local hot spots in plane, such as for example, along the trench surface 73 of the trench 72. It should also be understood that in other embodiments, the μ-cooler assembly 10 may include other arrangements and/or configurations than that shown and described above, as described herein below.

As discussed in greater detail herein, the liquid coolant 36 (FIG. 3) may flow from the plurality of mesh pores 64 of the mesh layers 90, via a capillary action, into the fluid channels 54 such that the liquid coolant 36 (FIG. 3) is received by and flows through each of the first and second plurality of MIO pores 82, 86 throughout the MIO secondary wicking structure 80 and contacts the trench surface 73 of the trench 72 for the purposes of heat transfer to cool the heat-generating device 11. As such, the second plurality of MIO pores 86 may be used to provide more wicking action of the liquid coolant 36 (FIG. 3) to various hot spots of the substrate 51. That is, the second plurality of MIO pores 86 may permit or enhance the capillary action of the liquid coolant 36 (FIG. 3) to replenish any of the liquid coolant that has evaporated due to heat on the substrate 51 and to prevent dry out.

In other words, with reference to FIGS. 3 and 5-7, as the liquid coolant 36 flows through the plurality of MIO pores 82, the second plurality of MIO pores 86 positioned within the trench 72, and/or other surface features of the substrate 51, in a capillary action, such that latent heat of the heat-generating device 11 is absorbed by the liquid coolant 36 due to the relative cooler temperature and phase change of the coolant. Additionally, with the heat effectively absorbed by the liquid coolant 36 received through the porous structure of the MIO secondary wicking structure 80, the heat is transferred throughout the substrate 51 and into the fluid outlet and/or into the vapor cavity 42 as the vapor 40 to draw the heat away from the heat-generating device 11.

It should be appreciated that the wicking structure 14, and/or the manifold case 16 and/or the cold plate 12 may be formed using additive manufacturing or an additive process. As used herein, the terms "additively manufactured" or "additive manufacturing techniques or processes" refer generally to manufacturing processes wherein successive layers of material(s) are provided on each other to "build-up," layer-by-layer, a three-dimensional component. The successive layers generally fuse together to form a monolithic component which may have a variety of integral sub-components. Although additive manufacturing technology is described herein as enabling fabrication of complex objects by building objects point-by-point, layer-by-layer, typically in a vertical direction, other methods of fabrication are possible and within the scope of the present subject matter. For example, although the discussion herein refers to the addition of material to form successive layers, one skilled in the art will appreciate that the methods and structures disclosed herein may be practiced with any additive manufacturing technique or manufacturing technology. For example, embodiments of the present invention may use layer-additive processes, layer-subtractive processes, or hybrid processes.

Suitable additive manufacturing techniques in accordance with the present disclosure include, for example, Fused Deposition Modeling (FDM), Selective Laser Sintering (SLS), 3D printing such as by inkjets and laserjets, Sterolithography (SLA), Direct Selective Laser Sintering (DSLS), Electron Beam Sintering (EBS), Electron Beam Melting (EBM), Laser Engineered Net Shaping (LENS), Laser Net Shape Manufacturing (LNSM), Direct Metal Deposition (DMD), Digital Light Processing (DLP), Direct Selective Laser Melting (DSLM), Selective Laser Melting (SLM), Direct Metal Laser Melting (DMLM), and other known processes.

The additive manufacturing processes described herein may be used for forming components using any suitable material. For example, the material may be plastic, metal, concrete, ceramic, polymer, epoxy, photopolymer resin, or any other suitable material that may be in solid, liquid, powder, sheet material, wire, or any other suitable form. More specifically, according to exemplary embodiments of the present subject matter, the additively manufactured components described herein may be formed in part, in whole, or in some combination of materials including but not limited to pure metals, nickel alloys, chrome alloys, titanium, titanium alloys, magnesium, magnesium alloys, aluminum, aluminum alloys, and nickel or cobalt base superalloys (e.g., those available under the name Inconel® available from Special Metals Corporation). These materials are examples of materials suitable for use in the additive manufacturing processes described herein, and may be generally referred to as "additive materials."

The above-described μ-cooler assembly provides for thermal management of integrated circuits and/or power electronics device utilizing a cold plate, a manifold with wicking structure, and an outer manifold case. A liquid coolant is wicked, via a capillary action, onto a substrate that has microstructures coated with a copper-inverse-opal (CIO) secondary wicking layer. The liquid coolant contacts the substrate and then evaporates while liquid coolant that does not contact the base structure is routed out of the μ-cooler. Vapor due to boiling at the cold plate rises, is collected in a top cavity and then exits the μ-cooler.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:
1. A cooler device comprising:
a cold plate comprising:
an array of bonding posts, each bonding post of the array of bonding posts having a first height; and
an array of fluid channels having a second height that is less than the first height, the array of bonding posts is orthogonal to the array of fluid channels, and a manifold with fluid wicking structure comprising:
a plurality of spacer elements and a plurality of mesh layers, each one of the plurality of spacer elements alternate with each one of the plurality of mesh layers in a stacked arrangement, the manifold with fluid wicking structure is in contact with the array of bonding posts.
2. The cooler device of claim 1, wherein each of the array of bonding posts include a pair of spaced apart sidewalls and an upper surface, the pair of spaced apart sidewalls separate each array of the array of fluid channels.
3. The cooler device of claim 2, wherein a metal inverse opal structure is positioned along the pair of spaced apart sidewalls and the upper surface of the array of bonding posts of the cold plate.

4. The cooler device of claim 1, wherein each of the array of fluid channels further comprises a trench having a trench surface, the trench surface having a seed layer that is graded in a lateral direction.

5. The cooler device of claim 4, wherein the trench further comprises a metal inverse opal structure positioned along the trench surface.

6. The cooler device of claim 5, wherein the metal inverse opal structure positioned along the trench surface is graded to have a plurality of larger voids at an upper portion and a plurality of smaller voids at a lower portion, the lower portion being in contact with the trench surface.

7. The cooler device of claim 1, further comprising:
a manifold case configured to be in contact with the cold plate and encapsulate the manifold with fluid wicking structure and the array of fluid channels.

8. The cooler device of claim 7, wherein the manifold case further comprises:
a fluid inlet;
a fluid outlet, wherein the fluid inlet is for receiving a liquid coolant into the manifold with fluid wicking structure, and the fluid outlet is for removing the liquid coolant from the manifold with fluid wicking structure; and
at least one vapor outlet, wherein the at least one vapor outlet is for removing a vapor from the manifold with fluid wicking structure.

9. The cooler device of claim 8, wherein the fluid inlet, the manifold with fluid wicking structure, and the fluid outlet are each fluidly isolated from the at least one vapor outlet.

10. The cooler device of claim 1, wherein the manifold with fluid wicking structure is bonded with the array of bonding posts.

11. An electronics assembly comprising:
a cooling assembly comprising:
a cold plate comprising:
an array of bonding posts, each of the bonding posts of the array of bonding posts having a first height;
an array of fluid channels having a second height that is less than the first height, the array of fluid channels having a trench with a trench surface; and
a metal inverse opal structure positioned along the trench surface of the array of fluid channels;
a manifold with fluid wicking structure comprising:
a plurality of spacer elements and a plurality of mesh layers, each one of the plurality of spacer elements alternate with each one of the plurality of mesh layers in a stacked arrangement, the manifold with fluid wicking structure is in contact with the array of bonding posts; and
a manifold case configured to be in contact with the cold plate and encapsulate the manifold with fluid wicking structure and the array of fluid channels.

12. The electronics assembly of claim 11, wherein the array of bonding posts is orthogonal to the array of fluid channels.

13. The electronics assembly of claim 12, wherein the metal inverse opal structure positioned along the trench surface is graded to have a plurality of larger voids at an upper portion and a plurality of smaller voids at a lower portion, the lower portion being in contact with the trench surface.

14. The electronics assembly of claim 11, wherein each of the array of bonding posts further comprises:
a pair of spaced apart sidewalls,
an upper surface extending from and between the pair of spaced apart sidewalls.

15. The electronics assembly of claim 14, wherein the metal inverse opal structure is positioned along each of the pair of spaced apart sidewalls and the upper surface of the array of bonding posts.

16. The electronics assembly of claim 11, wherein the manifold case further comprises:
a fluid inlet;
a fluid outlet, wherein the fluid inlet is for receiving a liquid coolant into the manifold with fluid wicking structure, and the fluid outlet is for removing the liquid coolant from the manifold with fluid wicking structure; and
at least one vapor outlet, wherein the at least one vapor outlet is for removing a vapor from the manifold with fluid wicking structure.

17. The electronics assembly of claim 16, wherein the fluid inlet, the manifold with fluid wicking structure, and the fluid outlet are each fluidly isolated from the at least one vapor outlet.

18. The electronics assembly of claim 11, wherein the manifold with fluid wicking structure is bonded with the array of bonding posts.

19. An assembly comprising:
a cooling assembly comprising:
a cold plate having a bonding area and a support member, the support member comprising:
an array of bonding posts, each of the bonding posts of the array of bonding posts comprise a pair of spaced apart sidewalls and an upper surface extending between and from the pair of spaced apart sidewalls, the array of bonding posts having a first height;
an array of fluid channels having a trench with a trench surface, the array of fluid channels having a second height that is less than the first height; and
a metal inverse opal structure positioned along the pair of spaced apart sidewalls of each of the array of bonding posts and the trench surface of each of the array of fluid channels;
a manifold with fluid wicking structure comprising:
a plurality of spacer elements and a plurality of mesh layers, each one of the plurality of spacer elements alternate with each one of the plurality of mesh layers in a stacked arrangement, the manifold with fluid wicking structure is in contact with the array of bonding posts; and
a manifold case configured to be in contact with the bonding area of the cold plate and encapsulate the manifold with fluid wicking structure and the support member.

20. The assembly of claim 19, wherein the metal inverse opal structure positioned along the trench surface is graded to have a plurality of larger voids at an upper portion and a plurality of smaller voids at a lower portion, the lower portion being in contact with the trench surface.

* * * * *

UNITED STATES PATENT AND TRADEMARK OFFICE
CERTIFICATE OF CORRECTION

PATENT NO. : 11,729,951 B2
APPLICATION NO. : 17/575071
DATED : August 15, 2023
INVENTOR(S) : Chi Zhang et al.

It is certified that error appears in the above-identified patent and that said Letters Patent is hereby corrected as shown below:

In the Specification

In Column 4, Line(s) 44, delete "Ga2O3" and insert --$Ga_2O_3$--, therefor.

In Column 5, Line(s) 13, after "fluid inlet 30", insert --,--.

In Column 5, Line(s) 28, delete "3 1b" and insert --31b--, therefor.

Signed and Sealed this
Second Day of April, 2024

Katherine Kelly Vidal
*Director of the United States Patent and Trademark Office*